United States Patent
Chan

(10) Patent No.: US 8,902,659 B2
(45) Date of Patent: Dec. 2, 2014

(54) SHARED-BIT-LINE BIT LINE SETUP SCHEME

(75) Inventor: Siu Lung Chan, San Jose, CA (US)

(73) Assignee: Sandisk Technologies, Inc., Plano, TX (US)

( * ) Notice: Subject to any disclaimer, the term of this patent is extended or adjusted under 35 U.S.C. 154(b) by 333 days.

(21) Appl. No.: 13/429,851

(22) Filed: Mar. 26, 2012

(65) Prior Publication Data

US 2013/0250687 A1 Sep. 26, 2013

(51) Int. Cl.
*G11C 11/34* (2006.01)
*G11C 16/04* (2006.01)
*G11C 7/12* (2006.01)
*G11C 16/24* (2006.01)

(52) U.S. Cl.
CPC *G11C 16/04* (2013.01); *G11C 7/12* (2013.01); *G11C 16/24* (2013.01)
USPC ............... 365/185.17; 365/185.25; 365/195; 365/203

(58) Field of Classification Search
CPC ........... G11C 16/04; G11C 16/24; G11C 7/12
USPC .................. 365/185.17, 185.25, 195, 203
See application file for complete search history.

(56) References Cited

U.S. PATENT DOCUMENTS

| | | | |
|---|---|---|---|
| 6,028,788 A | 2/2000 | Choi | |
| 6,091,633 A | 7/2000 | Cernea | |
| 6,620,683 B1 | 9/2003 | Lin | |
| 7,169,624 B2 | 1/2007 | Hsu | |
| 7,170,793 B2 | 1/2007 | Guterman | |
| 7,237,074 B2 | 6/2007 | Guterman | |
| 7,244,984 B2 | 7/2007 | Kamigaichi | |
| 7,286,406 B2 | 10/2007 | Lutze | |
| 7,295,478 B2 | 11/2007 | Wan | |
| 7,508,714 B2 | 3/2009 | Fasoli | |
| 7,719,902 B2 | 5/2010 | Dong | |
| 8,130,556 B2 | 3/2012 | Lutze | |
| 2007/0247912 A1 | 10/2007 | Kamigaichi | |

(Continued)

FOREIGN PATENT DOCUMENTS

WO WO2012/082223 6/2012

OTHER PUBLICATIONS

U.S. Appl. No. 13/107,686, filed May 13, 2011, by Mokhlesi.
U.S. Appl. No. 61/561,286, filed Nov. 18, 2011, by Mokhlesi.

(Continued)

*Primary Examiner* — Toan Le
(74) *Attorney, Agent, or Firm* — Vierra Magen Marcus LLP

(57) ABSTRACT

Methods for operating a non-volatile storage system utilizing a shared-bit-line NAND architecture are described. A shared-bit-line NAND architecture includes one or more pairs of NAND strings, wherein each pair of the one or more pairs of NAND strings shares a common bit line. In some embodiments, a pair of NAND strings includes an odd NAND string adjacent to an even NAND string. Prior to programming a memory cell associated with the even NAND string, an odd channel associated with the odd NAND string (i.e., the NAND string of the pair that is not selected for programming) is precharged to a bit line inhibit voltage, floated, and then boosted to a second voltage greater than the bit line inhibit voltage as an even channel associated with the even NAND string is precharged. Subsequently, the odd channel may be boosted (e.g., via self-boosting) prior to programming the memory cell.

20 Claims, 14 Drawing Sheets

(56) References Cited

U.S. PATENT DOCUMENTS

| | | |
|---|---|---|
| 2009/0302472 A1 | 12/2009 | Yoon |
| 2011/0019486 A1 | 1/2011 | Jang |
| 2011/0199829 A1* | 8/2011 | Lee et al. ............... 365/185.17 |
| 2012/0014184 A1 | 1/2012 | Dutta |
| 2012/0147676 A1* | 6/2012 | Mokhlesi et al. ........ 365/185.17 |

OTHER PUBLICATIONS

PCT International Search Report dated Mar. 8, 2013, PCT Patent Application No. PCT/US2012/066911.

PCT Written Opinion of the International Searching Authority dated Mar. 8, 2013, PCT Patent Application No. PCT/US2012/066911.

* cited by examiner (Prior Art)

(Prior Art)

First programming pass

Second programming pass

SHARED-BIT-LINE BIT LINE SETUP SCHEME

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection.

In recent years, NAND flash memory has been scaled (faster than Moore's law) in order to reduce cost per bit. However, as process geometries shrink, many design and process challenges are presented. These challenges include increased floating gate to floating gate coupling, increased cell to cell variability, increased bit line to bit line capacitance, increased bit line resistance, and increased bit line contact resistance.

DETAILED DESCRIPTION

Technology is described for operating a non-volatile storage system utilizing a shared-bit-line NAND architecture. A shared-bit-line NAND architecture includes one or more pairs of NAND strings, wherein each pair of the one or more pairs of NAND strings shares a common bit line. In some embodiments, a pair of NAND strings includes an odd NAND string adjacent to an even NAND string. Prior to programming a memory cell associated with the even NAND string, an odd channel associated with the odd NAND string (i.e., the NAND string of the pair that is not selected for programming) is precharged to a bit line inhibit voltage, floated, and then boosted to a second voltage greater than the bit line inhibit voltage as an even channel associated with the even NAND string is precharged. Subsequently, the odd channel may be boosted (e.g., via self-boosting) prior to programming the memory cell.

One benefit of the shared-bit-line NAND architecture is that it relieves the bit line pitch by 2× since pairing NAND strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. These benefits, however, come at the expense of reduced controllability of each NAND string. For example, during a programming operation only one NAND string of a pair of NAND strings may be programmed via the common bit line at a particular time. More information regarding the shared-bit-line memory architecture can be found in U.S. Provisional Application 61/561,286, "Improved Operation for Non-Volatile Storage System With Shared Bit Lines Connected to Single Selection Device" and U.S. Provisional Application 61/422,385, "Non-Volatile Storage System With Shared Bit Lines Connected to Single Selection Device," both of which are herein incorporated by reference in their entirety.

One example of a non-volatile storage system uses the NAND flash memory structure, which arranges multiple floating-gate transistors in series with and between two select gates. The floating-gate transistors in series and the select gates are referred to as a NAND string. Each of the floating-gate transistors includes a floating gate in which the amount of charge stored therein may be controlled in order to adjust the threshold voltage of the floating-gate transistor. The ability to adjust the threshold voltage allows each floating-gate transistor to act as a data storage element or memory cell. In some cases, more than one data bit per memory cell (i.e., a multi-level or multi-state memory cell) may be provided by programming and reading multiple threshold voltages or threshold voltage ranges.

Figure 1:
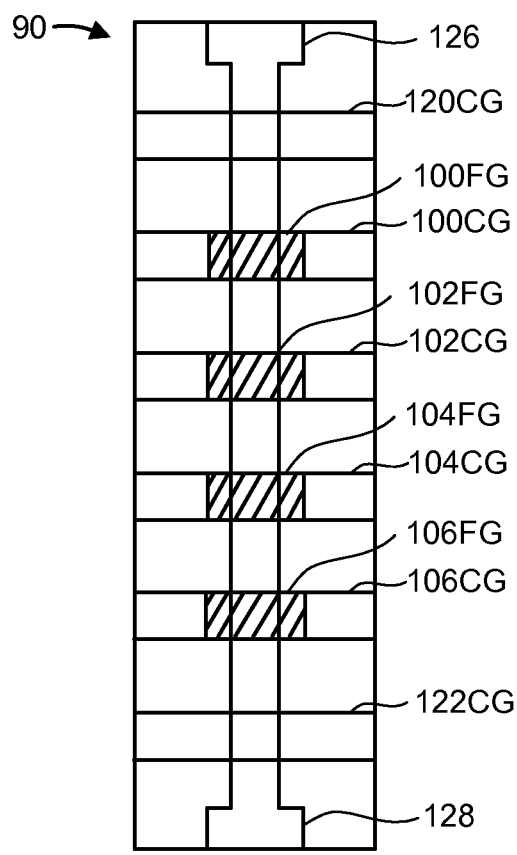
FIG. 1 depicts one embodiment of a NAND string.
Figure 2:
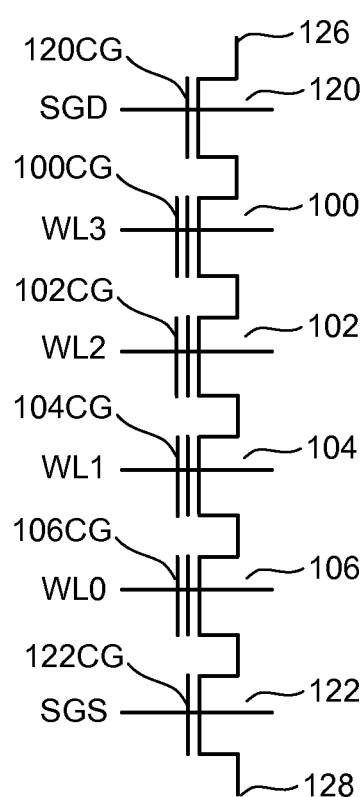
FIG. 2 depicts an equivalent circuit diagram for the NAND string of FIG. 1.

FIG. 1 depicts one embodiment of a NAND string 90. FIG. 2 depicts an equivalent circuit diagram for the NAND string of FIG. 1. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string to a bit line 126. Select gate 122 connects the NAND string to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 has a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string can have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include a plurality of NAND strings within a memory block. A memory block may comprise a unit of erase. In some cases, the NAND strings within a memory block may share a common well (e.g., a P-well). Each NAND string is connected to a common source line by its source select gate controlled by select line SGS and connected to its associated bit line by its drain select gate controlled by select line SGD. The use of the terms connect, connected, and connection in this document can include a direct connection or an indirect connection. Typically, each bit line runs on top of its associated NAND string in a direction perpendicular to the word lines and is connected to a sense amplifier. Relevant examples of NAND type flash memories and their operation are provided in the following U.S. Patents/Patent Applications, all of which are herein incorporated by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. Other types of non-volatile storage devices, in addition to NAND flash memory, can also be used.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation. Generally, it is important for an appropriate amount of boosting to be used. If the boosting is too low, an inhibited storage element may experience program disturb, in which its threshold voltage is raised to a next higher data state, or to a level at which the storage element cannot be accurately read. On the other hand, if boosting is too high, electromagnetic coupling effects can raise the threshold voltages of the selected storage elements excessively, resulting in undesirable widening of the threshold voltage distributions.

Figure 3:
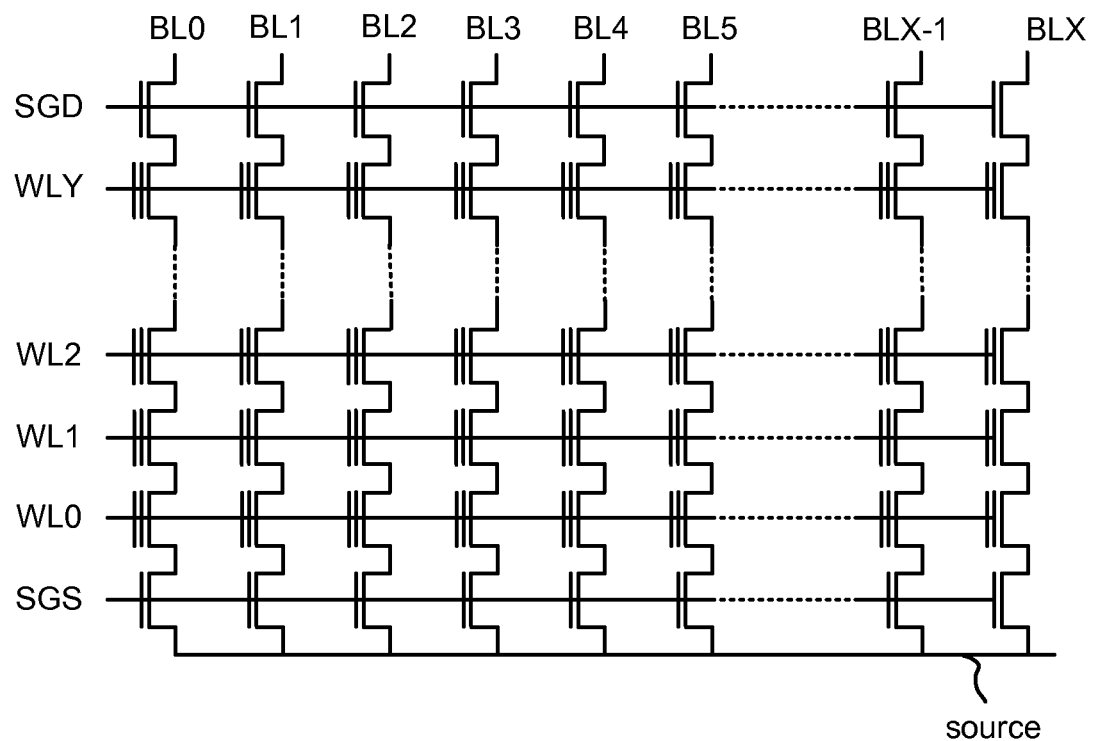
FIG. 3 provides one example of a memory block including a plurality of NAND strings.

FIG. 3 provides one example of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain side select gate controlled by the drain side selection signal SGD. Each NAND string is connected to a source line (source) via a source side select gate controlled by source side selection signal SGS.

In order to save space on a semiconductor die, it is proposed that two adjacent NAND strings (or other grouping in memory cells) share a common bit line (i.e., a shared-bit-line memory architecture). In some cases, more than two NAND strings may share a common bit line. One proposal for having two adjacent NAND strings share a common bit line includes using two select gates at the drain side of each NAND string of the NAND string pair in order to connect or disconnect the NAND string from the common bit line. Referring to FIG. 3, in one example, the signal SGD would be replaced by two drain side selection signals SGD1 and SGD2. Each NAND string of the pair would then have two drain side select gates, each connected to a different drain side selection signal of the two drain side selection signals SGD1 and SGD2. One of the two drain side select gates for each NAND string would be a depletion mode transistor with its threshold voltage lower than 0 volts. One problem with using two select gates on the drain side of each NAND string is that two drain side select gates (as compared to one drain side select transistor) requires more area on the die. Therefore, from an integrated circuit area standpoint, it may be beneficial to only use one drain side selection gate for each NAND string and then connect each NAND string of the pair with only one of the two drain side selection signals.

Figure 4:
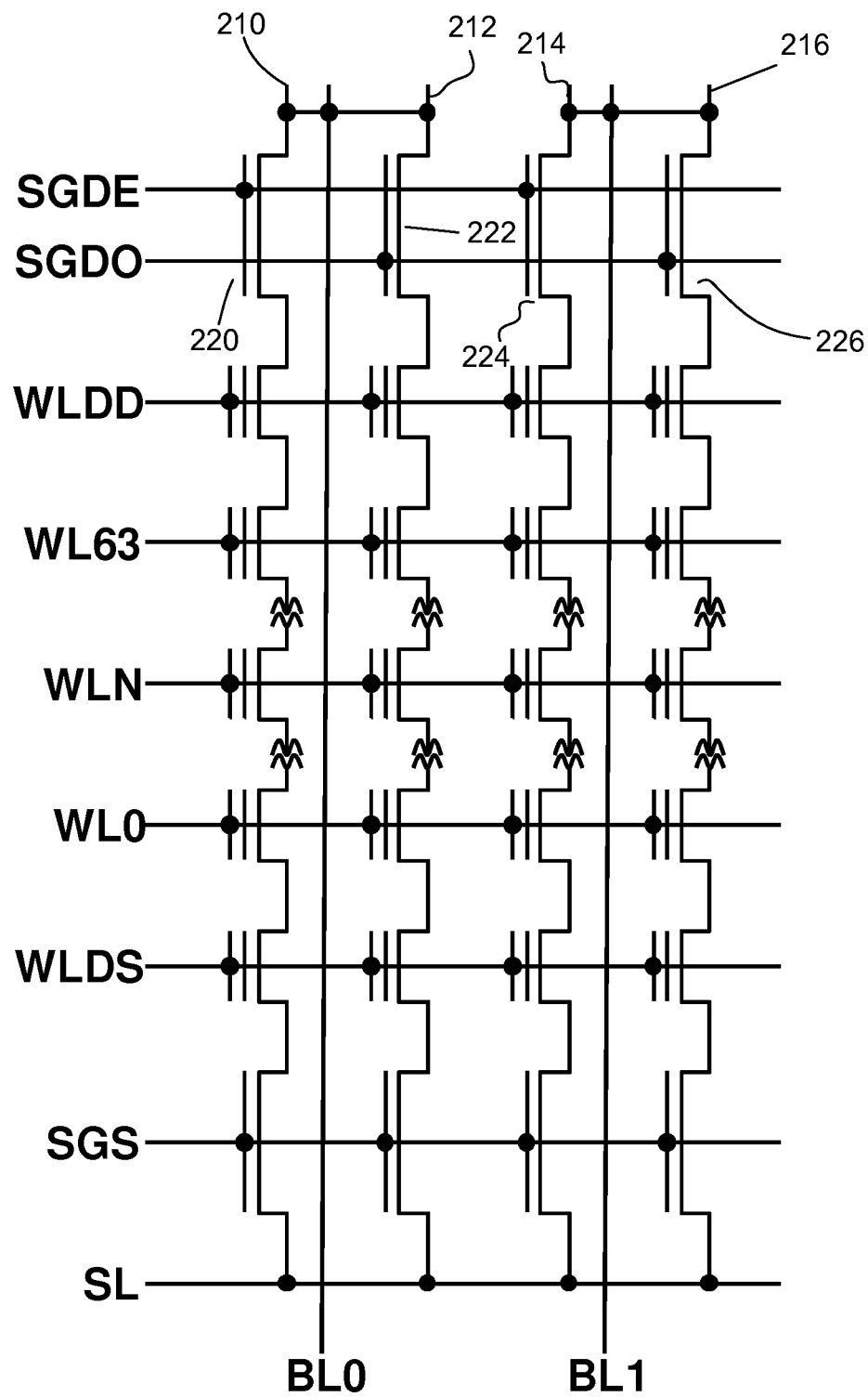
FIG. 4 depicts one embodiment of a non-volatile storage system in which a bit line is shared between two adjacent NAND strings within a memory block.

FIG. 4 depicts one embodiment of a non-volatile storage system in which a bit line is shared between two adjacent NAND strings within a memory block. As depicted, the non-volatile storage system includes four NAND strings (i.e., two pairs of NAND strings corresponding with bit lines BL0 and BL1). Each NAND string includes 64 memory cells corresponding with word lines WL0-WL63. There are two dummy memory cells corresponding with word lines WLDS and WLDD, one on each side of the 64 memory cells. In other embodiments, more than or less than 64 memory cells may be included within a NAND string. The non-volatile storage system includes two drain side selection signals SGDE and SGDO and two bit lines BL0 and BL1. Bit line BL0 is connected to NAND string 210 and NAND string 212. Bit line BL1 is connected to NAND string 214 and NAND string 216. The drain side selection signal SGDE is used to select or unselect NAND string 210 and NAND string 214. The drain side signal SGDO is used to select or unselect NAND string 212 and NAND string 216. Each NAND string only includes one drain side selection gate, implemented as a single transistor. For example, NAND string 210 includes drain side selection gate 220, NAND string 212 includes drain side selection gate 222, NAND string 214 includes drain side selection gate 224, and NAND string 216 includes drain side selection gate 226. Drain side selection signal line SGDE is in communication with selection gate 210 and selection gate 214. Drain side selection signal SGDO is in communication with selection gate 222 and selection gate 226. Each NAND string is in communication with a source line SL via a source select gate controlled by source side selection signal SGS.

Figure 5:
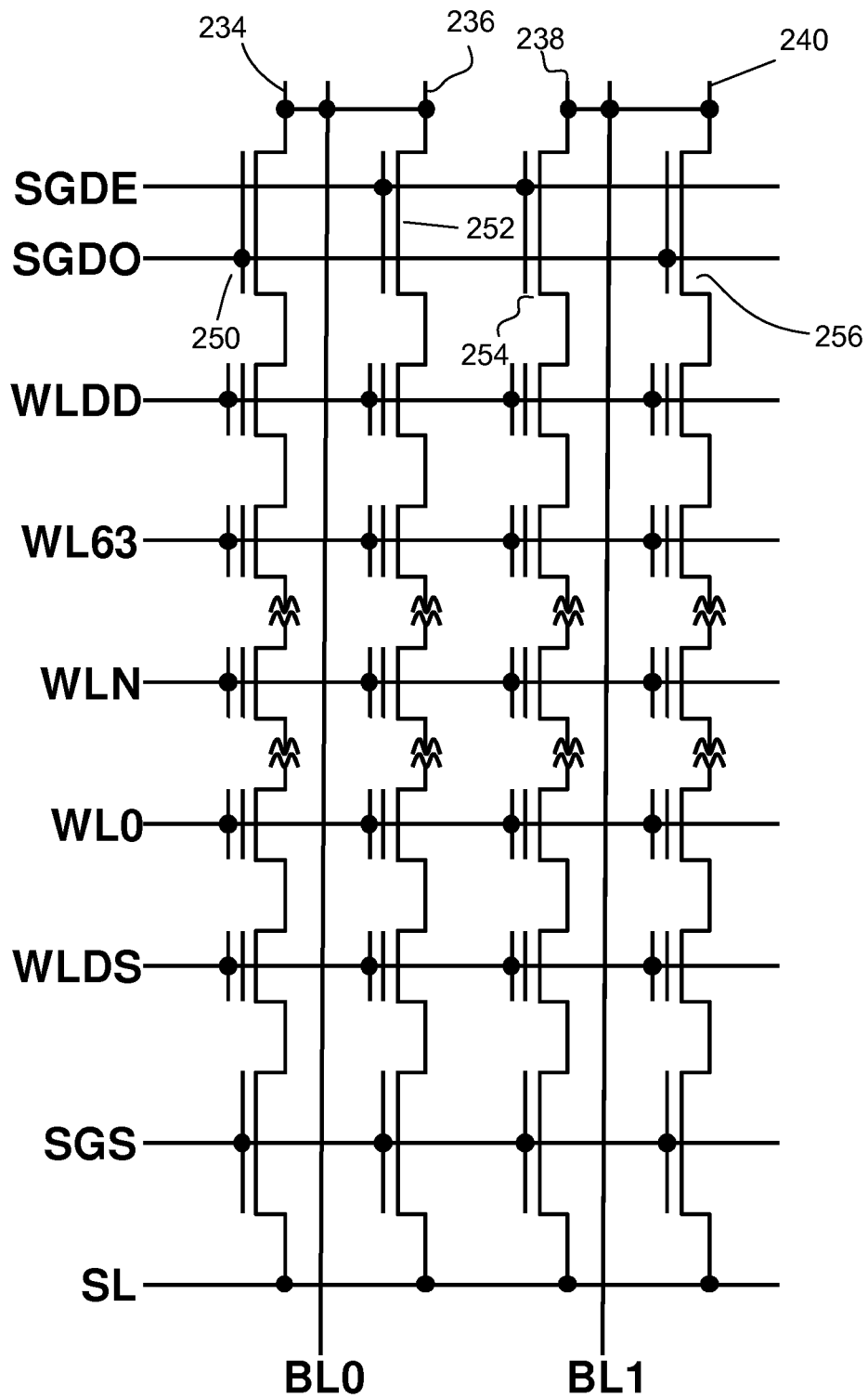
FIG. 5 provides an alternative embodiment of a non-volatile storage system in which a bit line is shared between two adjacent NAND strings.

FIG. 5 provides an alternative embodiment of a non-volatile storage system in which a bit line is shared between two adjacent NAND strings. As depicted, the non-volatile storage system includes four NAND strings (i.e., two pairs of NAND strings corresponding with bit lines BL0 and BL1). The non-volatile storage system includes two drain side selection signals SGDE and SGDO and two bit lines BL0 and BL1. Bit line BL0 is connected to and shared by NAND string 234 and NAND string 236. Bit line BL1 is connected to and shared by NAND string 238 and NAND string 240. The drain side selection signal SGDE is in communication with selection gate 252 and selection gate 254. The drain side selection signal SGDO is in communication with selection gate 250 and selection gate 256. Each NAND string is in communication with a source line SL via a source select gate controlled by source side selection signal SGS. A difference between the embodiments of FIG. 4 and FIG. 5 is that the embodiment of FIG. 4 alternates the connections of the drain side select signals such that every other NAND string has its drain side selection gate in communication with the same drain side selection signal while the embodiment of FIG. 5 has adjacent pairs of NAND strings in communication with the same drain side selection signal.

Figure 6A:
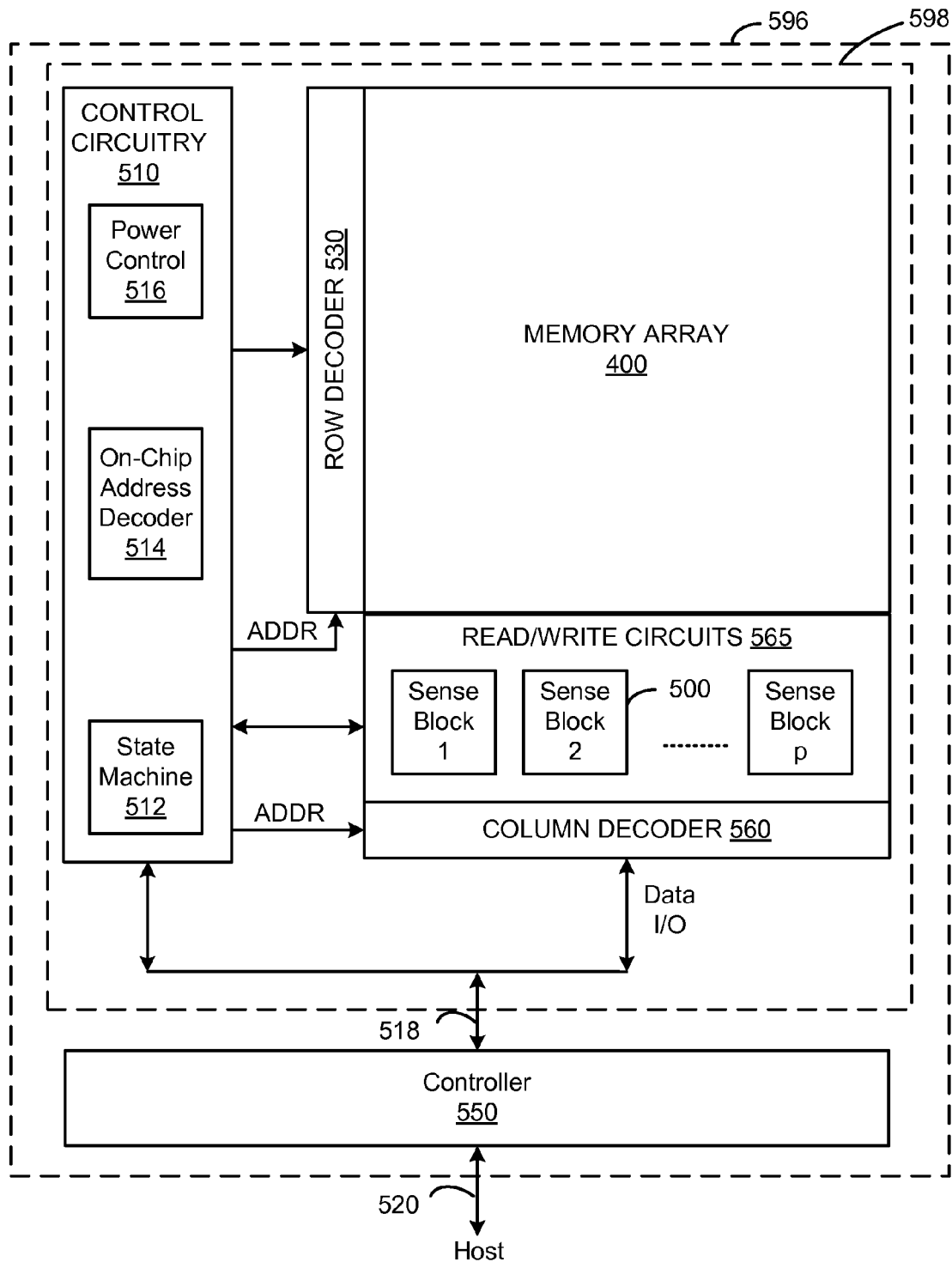
FIG. 6A depicts one embodiment of a non-volatile storage system including read/write circuits for reading and programming a page of memory cells in parallel.

FIG. 6A depicts one embodiment of a non-volatile storage system 596 including read/write circuits for reading and programming a page (or other unit) of memory cells (e.g., NAND multi-level cells) in parallel, including memory cells on NAND strings sharing bit lines as described above. As depicted, nonvolatile storage system 596 includes a memory die 598 and controller 550. Memory die 598 includes a memory array 400 (e.g., a two-dimensional or three-dimensional array of storage elements), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block is the unit of erase. That is, each block contains the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page is a unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6B:
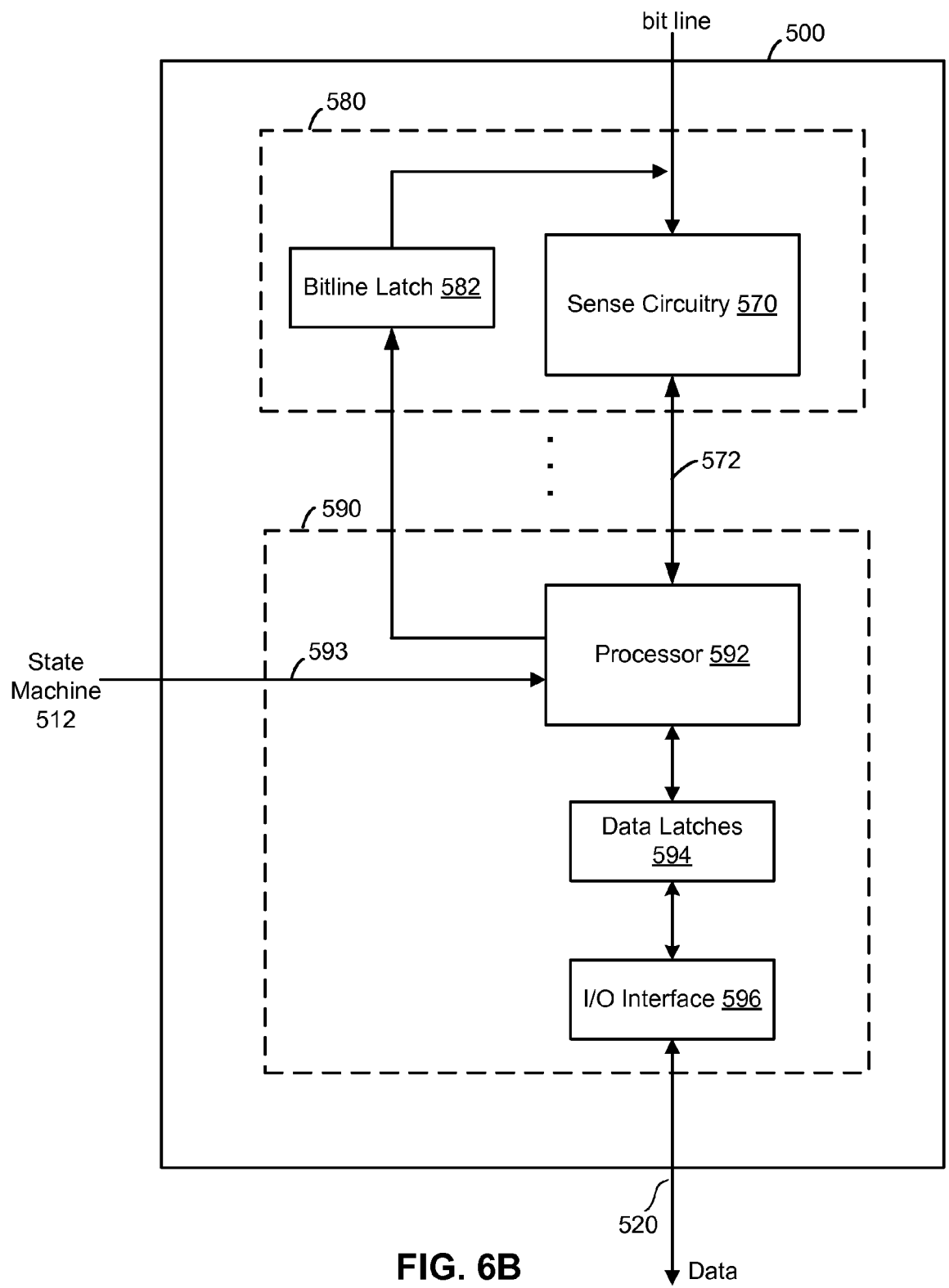
FIG. 6B depicts one embodiment of a sense block.

FIG. 6B depicts one embodiment of a sense block 500, such as sense block 500 in FIG. 6A. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 6A. I/O interface 596 provides an interface between data latches 594 and the data bus 520.

During a read operation or other storage element sensing operation, a state machine, such as state machine 512 of FIG. 6A, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
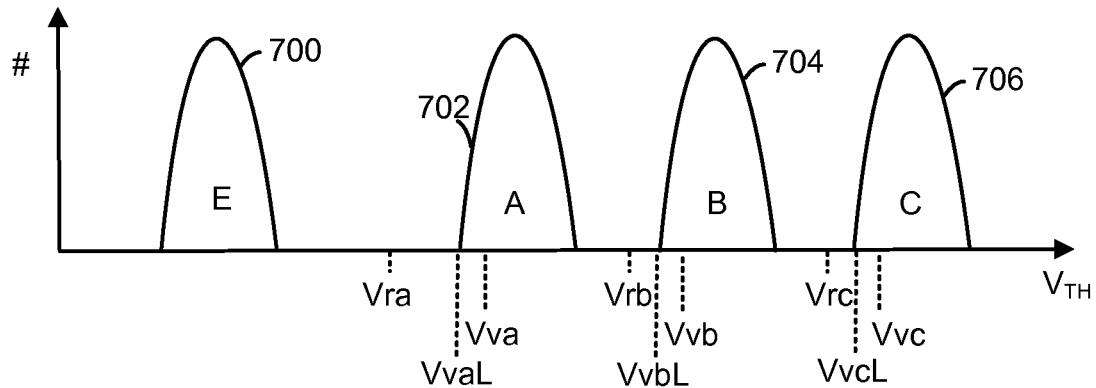
FIG. 7A depicts an example set of threshold voltage distributions for a four-state memory device in which each storage element stores two bits of data.

FIG. 7A depicts an example set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A, B and C distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8A:
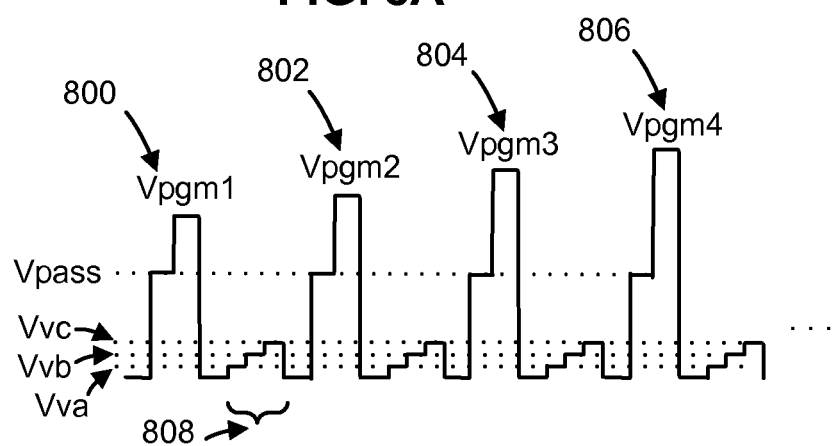
FIG. 8A depicts a series of program and verify pulses which are applied to a selected word line during a programming operation.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 8A, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
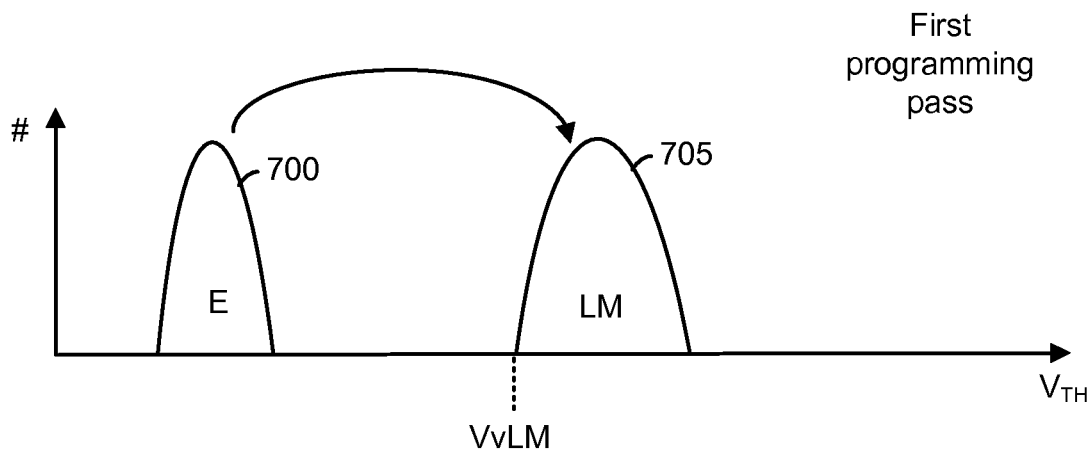
FIG. 7B illustrates a first pass of a two-pass programming technique.

FIG. 7B illustrates a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower middle) state (distribution 705).

Figure 9A:
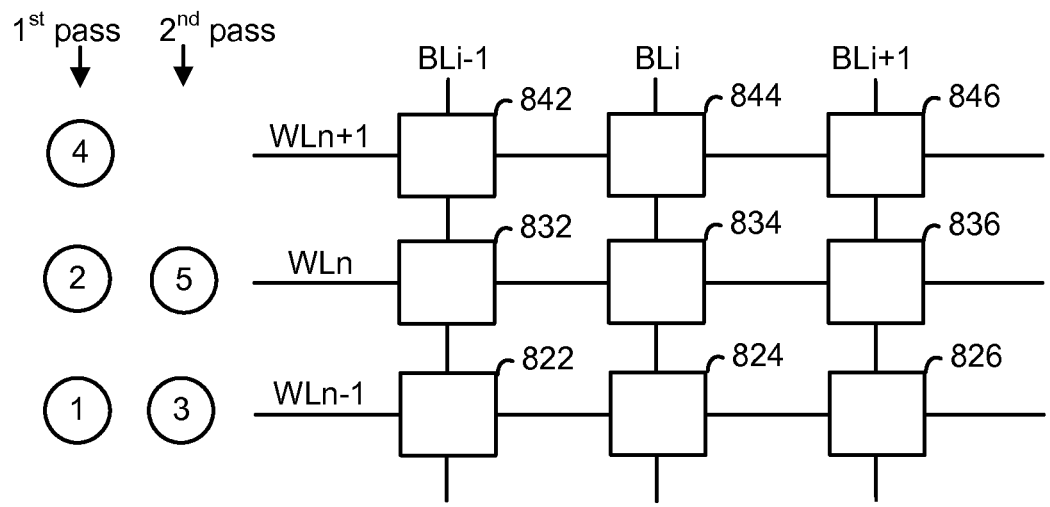
FIG. 9A depicts a multi-pass program operation for a set of storage elements.

In one embodiment, after a storage element is programmed from the E-state to the LM-state, as indicated by step "1" in FIG. 9A, its neighbor storage element on an adjacent word line WLn+1 in the NAND string will then be programmed with respect to its lower page in a respective first programming pass of the adjacent word line, as indicated by step "2" in FIG. 9A.

Figure 7C:
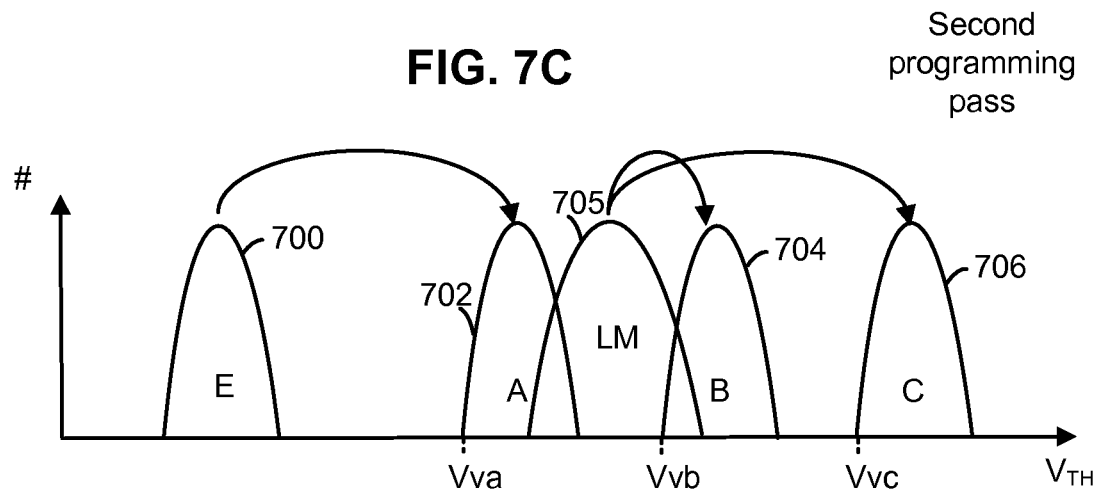
FIG. 7C illustrates a second pass of the two-pass programming technique referred to in FIG. 7B.

FIG. 7C illustrates a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 9A. The second pass of the two-pass programming technique for WLn+1 is indicated by step "5" in FIG. 9A.

Figure 7D:
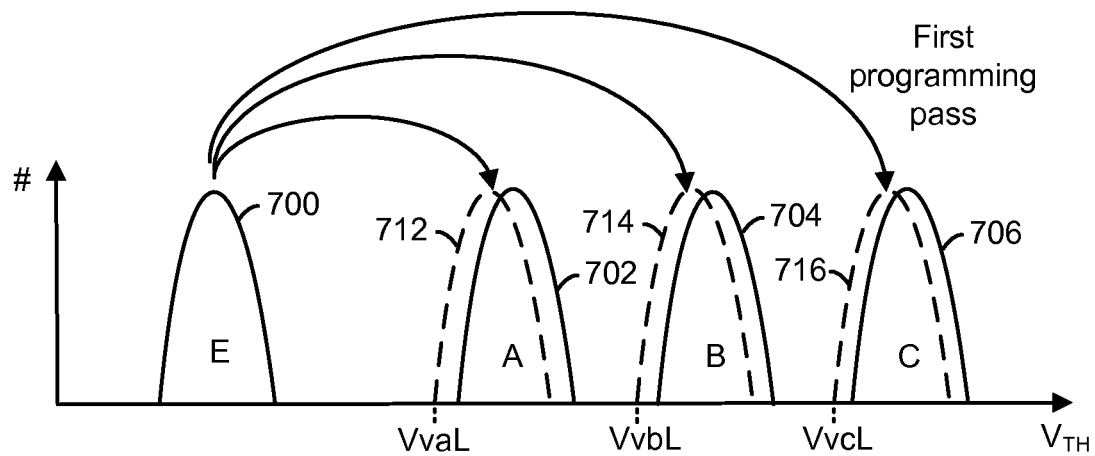
FIG. 7D illustrates a first pass of another two-pass programming technique.

FIG. 7D illustrates a first pass of another two-pass programming technique. In this example, referred to as course-fine programming, the A-state, B-state and C-state storage elements are programmed from the E-state to distributions 712, 714 and 716, respectively, using lower verify levels VvaL, VvbL and VvcL, respectively. This is the course programming pass. A relatively large program voltage step size may be used, for instance, to quickly program the storage elements to the respective lower verify levels.

Figure 7E:
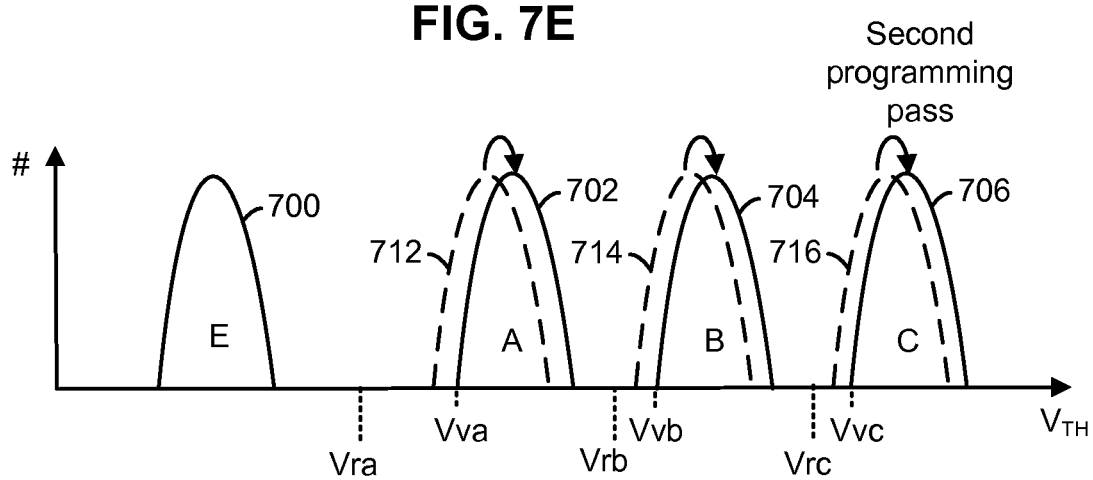
FIG. 7E illustrates a second pass of the two-pass programming technique referred to in FIG. 7D.

FIG. 7E illustrates a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts taught can be applied to other implementations with more or fewer than four states and more or fewer than two pages. For example, memory devices with eight or sixteen states per storage element are currently planned or in production. Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

FIG. 8A depicts a series of program and verify pulses which are applied to a selected word line during a programming operation. A programming operation may include multiple program-verify iterations, where each iteration applies one or more programming voltages followed by one or more verify voltages, to a selected word line. In one embodiment, the program voltages are stepped up in successive iterations. Moreover, each program voltage may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, a Vpgm3 and Vpgm4, respectively, and so forth. One or more verify voltages, such as verify voltages Vva, Vvb and Vvc (808), may be provided after each program pulse. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

Figure 8B:
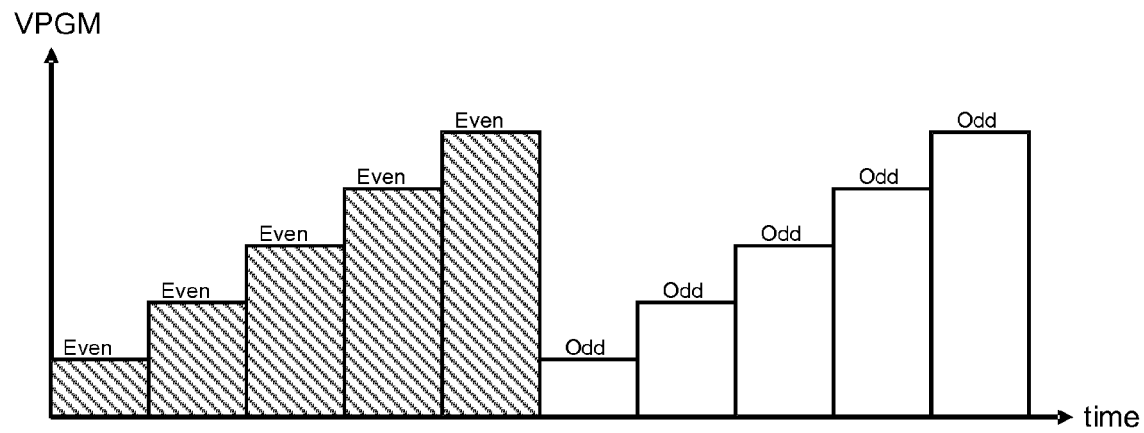
FIG. 8B depicts one embodiment in which even NAND strings are programmed first (while the odd NAND strings are inhibited from programming) with a set of program pulses having magnitudes that increase for each successive pulse.
Figure 8C:
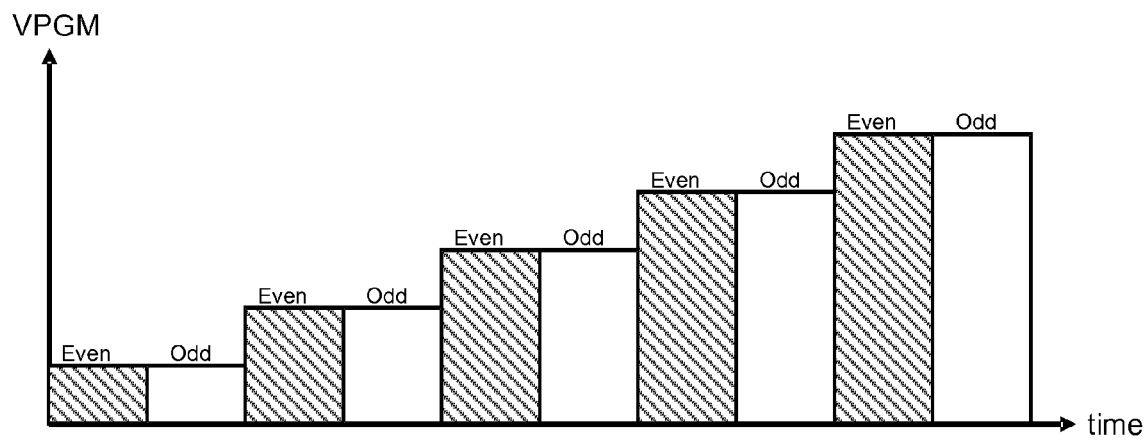
FIG. 8C depicts one embodiment where programming of even NAND strings is interleaved with programming of odd NAND strings.

As mentioned above, the program voltage Vpgm is applied as a series of pulses. FIGS. 8B and 8C show two different embodiments of program voltage pulses. For both figures, the shaded pulses program the even NAND strings while inhibiting the odd NAND strings. The unshaded pulses program the odd NAND strings while inhibiting the even NAND strings.

FIG. 8B depicts one embodiment in which the even NAND strings are programmed first (while the odd NAND strings are inhibited from programming) with a set of program pulses having magnitudes that increase for each successive pulse. After the even NAND strings have completed programming, then the odd NAND strings are programmed (while the even NAND strings are inhibited from programming) with a set of program pulses having magnitudes that increase for each successive pulse. In this embodiment, data for even NAND strings are first loaded into data latches and then the even NAND strings are programmed. After the even NAND strings are programmed, then data for odd NAND strings is loaded into data latches and then the odd NAND strings are programmed.

FIG. 8C depicts one embodiment where programming of even NAND strings is interleaved with programming of odd NAND strings. For example, a program pulse for even NAND strings at a first magnitude is applied, followed by a program pulse for odd NAND strings at the first magnitude being applied, followed by a program pulse for even NAND strings at a second magnitude being applied (the second magnitude is greater than the first magnitude by a step size), followed by a program pulse for odd NAND strings at the second magnitude being applied, etc. In the case of the interleaved programming depicted in FIG. 8C, verify operations can be performed after each pair of programming pulses that are at the same programming voltage have been applied.

In some embodiments, extra latches may be needed to engage interleaved programming. For example, in an embodiment of 2 bits per cell technology, we may add 2 extra latches per sense amplifier (i.e. per bit line) just to accommodate the extra 2 bits of data that are associated with interleaved programming. If coarse/fine programming is to be utilized also, then an additional third latch may also be required. Thus, in some embodiments of coarse/fine programming with 2 bits per memory cell, the number of latches per sense amplifier (or per bit line) grows from 4 to 7.

FIG. 9A depicts a multi-pass program operation for a set of storage elements. The components depicted may be a subset of a much larger set of storage elements, word lines and bit lines. In one possible program operation, storage elements on WLn-1, e.g., storage elements 822, 824 and 826, are programmed in a first programming pass. This step is represented by the circled "1." Next ("2"), storage elements on WLn, e.g., storage elements 832, 834 and 836, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (i.e., make conductive) the unselected storage elements so that a sensing operation can occur for the selected word line. Next ("3"), storage elements on WLn−1 are programmed in a second programming pass. Next ("4"), storage elements on WLn+1, e.g., storage elements 842, 844 and 846, are programmed in a first programming pass. Next ("5"), the storage elements on WLn are programmed in a second programming pass to their respective target states.

Figure 9B:
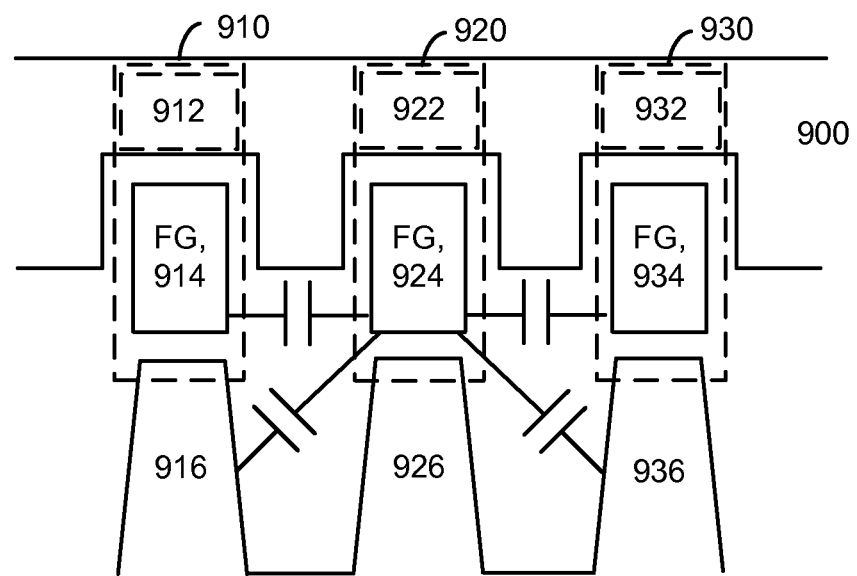
FIG. 9B depicts a cross-sectional view of NAND strings showing channel-to-floating gate coupling and floating gate-to-floating gate coupling.

FIG. 9B depicts a cross-sectional view of NAND strings showing channel-to-floating gate coupling and floating gate-to-floating gate coupling. A bit line or NAND string direction goes into the page, and a word line direction goes from left to right. A word line 900 extends across multiple NAND strings. A first NAND string includes a channel region 916. A storage element 910 in the first NAND string includes a control gate 912, which is a portion of the word line 900, and a floating gate 914. A second NAND string includes a channel region 926. A storage element 920 in the second NAND string includes a control gate 922, which is a portion of the word line 900, and a floating gate 924. A third NAND string includes a channel region 936. A storage element 930 in the third NAND string includes a control gate 932, which is a portion of the word line 900, and a floating gate 934.

As memory devices are scaled down, storage element-to-storage element interferences play an increasingly important role. One of these interferences is channel-to-floating gate coupling during programming. In all-bit line programming, consider a selected storage element 920 of a selected word line which undergoes programming. When a storage element (e.g., 910 or 930) of a neighbor bit line, on the same word line 900, reaches its target data state, it is locked out or inhibited from further programming. In the next program iteration, a substrate channel region (e.g., 916 or 936) of the locked out storage element is boosted to prevent the floating gate (e.g., 914 or 934) of the storage element from being programmed further when a program pulse is applied to the selected word line. The boosted potential in the channel couples up to the floating gate 924 of the selected storage element 920, leading to an increase in the effective program voltage (Vpgm) which is seen by the selected storage element when a program pulse is applied. This results in a larger jump in the Vth of the selected storage element than is desired. The Vth distributions of the storage elements can therefore be widened undesirably. In addition to this channel-to-floating gate coupling, floating gate-to-floating gate also further increase the effective Vpgm which is seen by a selected storage element. This is represented by coupling from floating gates 914 and/or 934 to floating gate 924.

Moreover, in a more severe case, if both of the adjacent neighbor storage elements of a selected storage element lock out together, then during the next program iteration their channels will both be inhibited. The neighbor channels (e.g., 916 and 936) will be boosted to Vchannel, so that their floating gates (e.g., 914 and 934) are also boosted to a higher potential. Whenever a channel is boosted, a part of Vchannel gets coupled to the floating gate and hence raises the floating gate potential. For example, about 15% of Vchannel in the neighbor channels 916 and 936 may be coupled to the floating gates 914 and 934, respectively. Both Vchannel and the neighbor floating gate potential couple up to the floating gate 924 of the selected storage element and increase the effective Vpgm. The amount of coupling depends on Vchannel, coupling from the channel (916 and/or 936) to the floating gate (914 and/or 934), and coupling from the floating gates 914 and/or 934 to the floating gate 924. With scaling, these couplings become greater, resulting in an increase of the magnitude of the capacitive coupling effect described above.

Figure 10A:
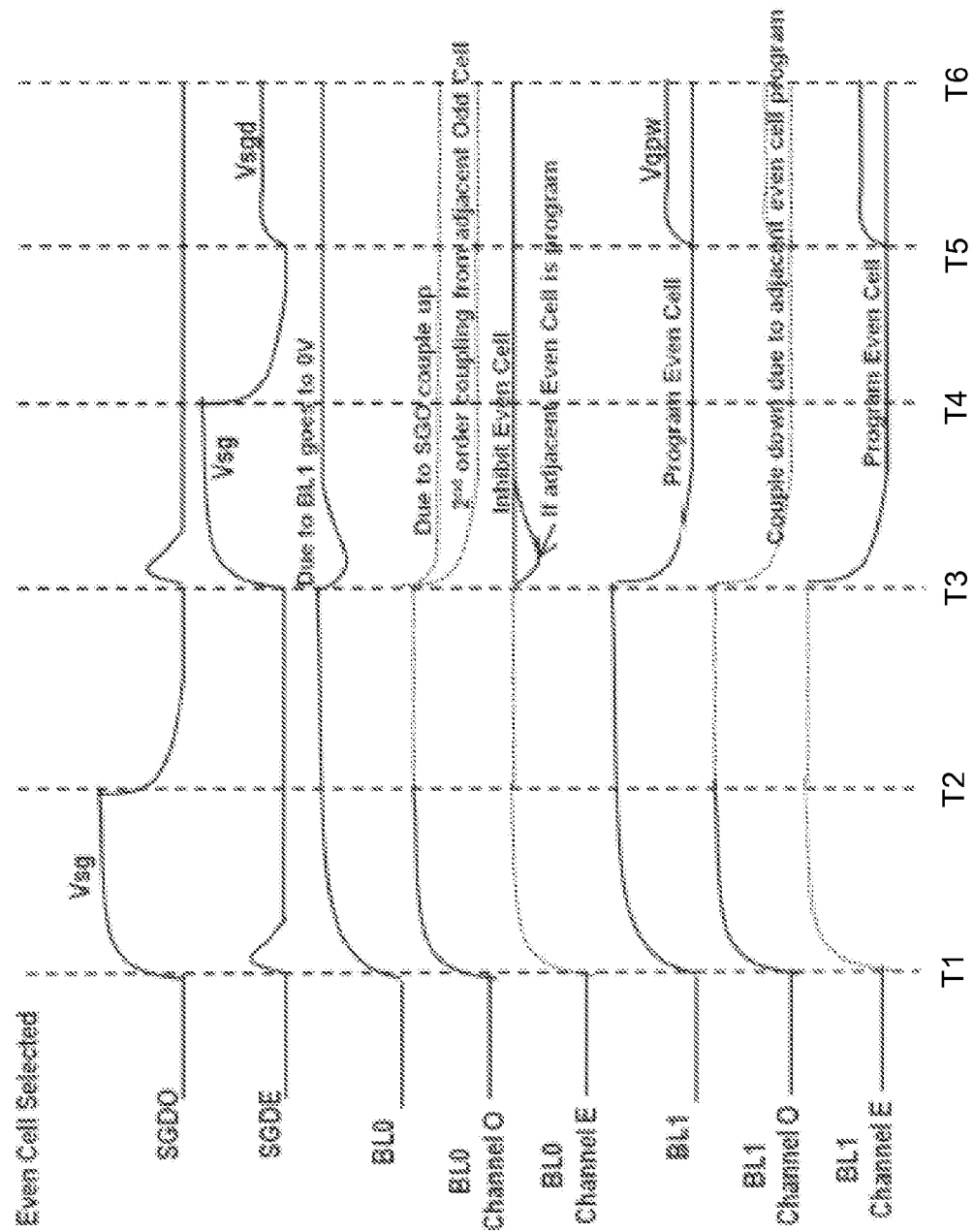
FIG. 10A depicts one embodiment of a NAND string setup scheme used prior to self-boosting of the NAND string.
Figure 10B:
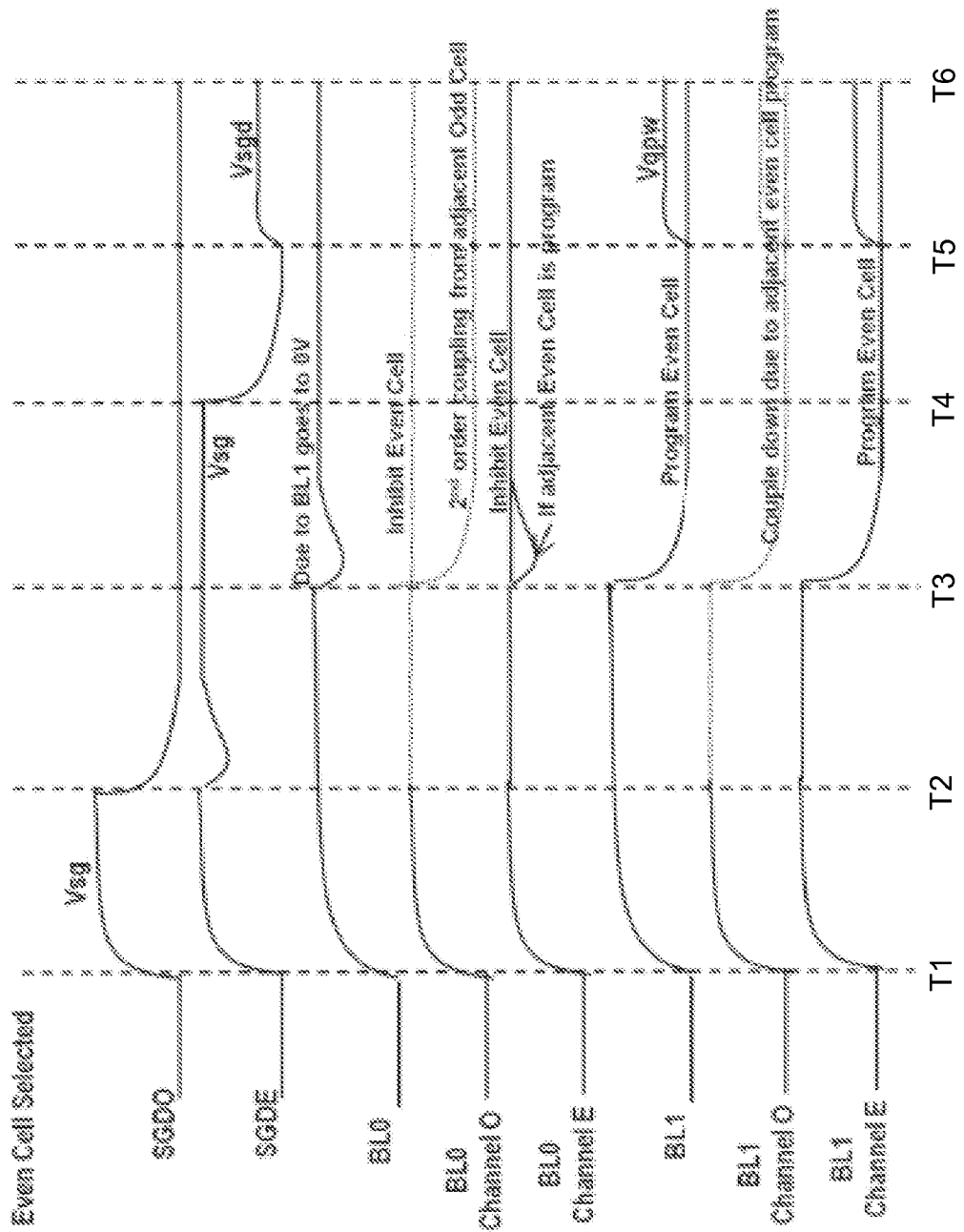
FIG. 10B depicts an alternative embodiment of a NAND string setup scheme used prior to self-boosting of the NAND string.
Figure 10C:
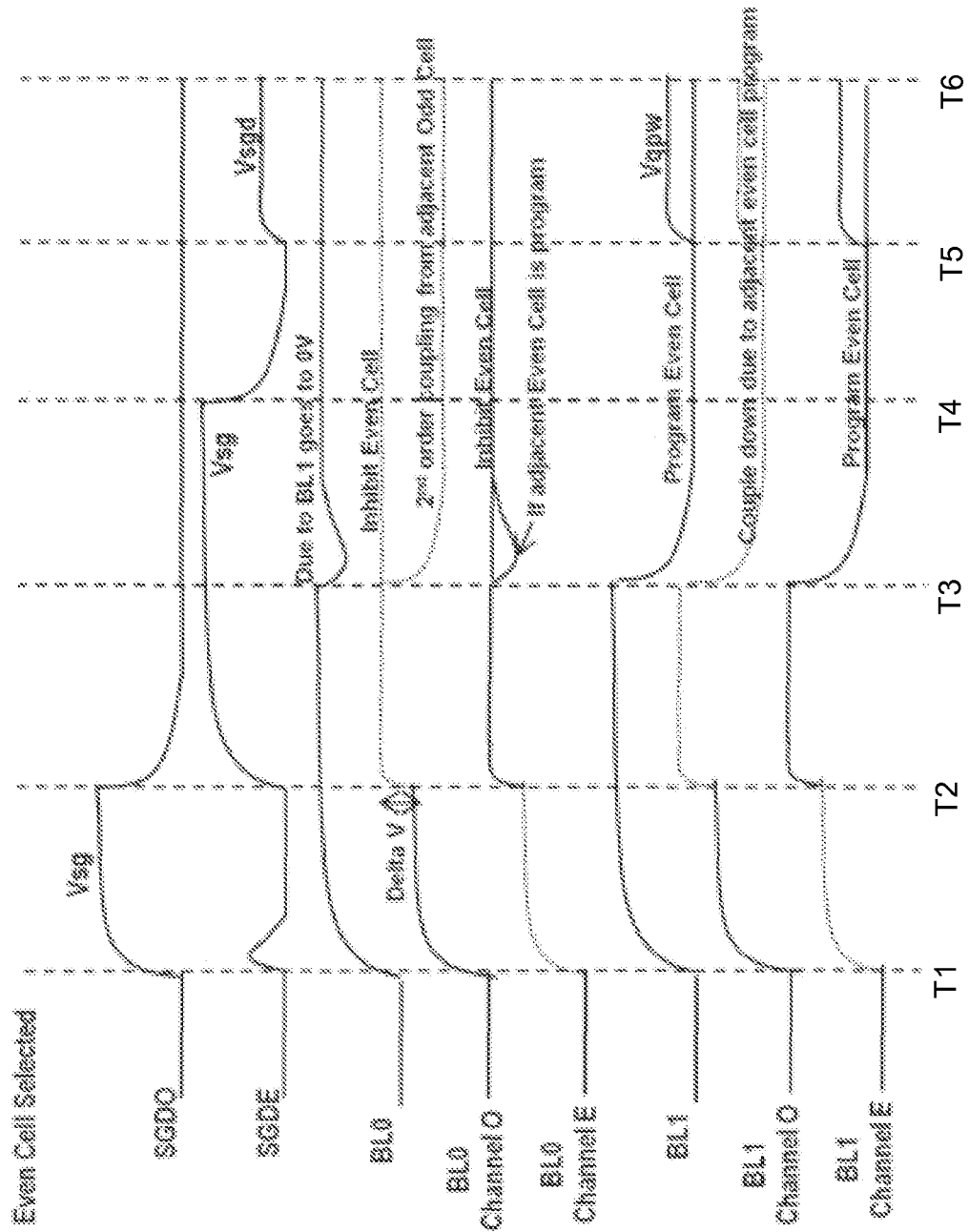
FIG. 10C depicts one embodiment of a NAND string setup scheme used prior to self-boosting of the NAND string.

One issue with using a shared-bit-line NAND architecture is that during a programming operation only one NAND string of a pair of NAND strings (i.e., the actively controlled NAND string) will be controlled via a shared bit line. The other NAND string of the pair of NAND strings (i.e., the uncontrolled NAND string) may be left uncontrolled or floated due to its drain side select gate being placed into a non-conducting state during programming of memory cells associated with the actively controlled NAND string. FIGS. 10A-10C provide examples of various NAND string setup schemes for setting up a channel of the uncontrolled NAND string prior to self-boosting the channel of the uncontrolled NAND string via word line coupling. In some embodiments, the channel of the uncontrolled NAND string may be adjusted prior to self-boosting by controlling a channel of the actively controlled NAND string (e.g., via capacitive coupling). After the channel of the uncontrolled NAND string has been self-boosted, the memory cells associated with the actively controlled NAND string may be programmed by applying a programming voltage to a selected word line common to both the uncontrolled NAND string and the actively controlled NAND string.

In FIGS. 10A-10C, the signals SGDO, SGDE, BL0, and BL1 may correspond with the signals described in reference to either FIG. 4 or FIG. 5. SGDO is the control line for the drain side select gate for an odd NAND string of a pair of NAND strings sharing a common bit line. SGDE is the control line for the drain side select gate for an even NAND string of the pair of NAND strings. BL0 is a first shared bit line for a first pair of NAND strings and BL1 is a second shared bit line for a second pair of NAND strings. The first pair of NAND strings may be adjacent (i.e., physically located next to) the second pair of NAND strings. "BL0 channel O" corresponds with the channel of the odd NAND string for the first pair of NAND strings. "BL0 channel E" corresponds with the channel of the even NAND string for the first pair of NAND strings. "BL1 channel O" corresponds with the channel of the odd NAND string for the second pair of NAND strings. "BL1 channel E" corresponds with the channel of the even NAND string for the second pair of NAND strings. Dotted lines are used to illustrate when a node (e.g., a channel associated with a NAND string) is floating (i.e., not actively driven or biased to a particular voltage).

Although FIGS. 10A-10C depict setup schemes for precharging a pair of NAND strings that involve programming memory cells associated with an even NAND string. The concepts described herein may also be applied to setup schemes for precharging a pair of NAND strings that involve programming memory cells associated with odd NAND strings.

FIG. 10A depicts one embodiment of a NAND string setup scheme used prior to self-boosting of the NAND string. As depicted, at time T1, BL0 and BL1 are charged up to a bit line inhibit voltage (e.g., 2V) and SGDO is charged up to Vsg (e.g., 4V or other voltage that allows the bit line voltage to fully pass to the NAND strings) in order to precharge the channels of the odd NAND strings. Since SGDE is set at 0V, the channels of the even NAND strings are floated, as shown by the dotted lines. However, due to capacitive coupling between the charged up channels of adjacent odd NAND strings, the channels of the even NAND strings are coupled up. Assuming a channel coupling ratio of 40%, the channels of the even NAND strings will couple up to 0.8V (i.e., 2V*0.4). The bump in SGDE at time T1 is caused by capacitive coupling from SGDO charging up.

At time T2, SGDO is discharged to 0V. Between times T2 and T3, all bit lines stay high and all channels are floated. At time T3, SGDE is charged up to Vsg and BL1 is set to a bit line programming voltage (e.g., 0V). In response, the channel of the even NAND string ("BL1 channel E") is driven to 0V in preparation for programming a memory cell associated with the even NAND string controlled by BL1. Because the channels of the odd NAND strings are left floating, the discharge of "BL1 channel E" from 0.8V to 0V will cause the floating channel of "BL1 channel O" to couple down as well. Assuming a channel coupling ratio of 40%, "BL1 channel O" will couple down to 1.68V (i.e., 2V−0.8V*0.4). Another issue is that "BL0 channel O" may leak or lose charge due to BL0 being coupled down by BL1 and SGDO being coupled up by SGDE.

As BL0 stays high, the channel of the inhibited even NAND string will stay high. The potential bump in BL0 at time T3 is caused by capacitive coupling from BL1 being discharged to a bit line programming voltage (e.g., 0V). As the channels of the odd NAND strings are floated, "BL0 channel O" may couple down due to second order coupling (e.g., from an adjacent odd channel being coupled down). The bump in SGDO at time T3 is caused by capacitive coupling from SGDE charging up. At time T4, SGDE is discharged to 0V. At time T5, SGDE is set to Vsgd (e.g., 2V). In some cases, the bit line programming voltage may be adjusted in order to slow down programming of memory cells (e.g., by increasing the bit line voltage to a quick pass write voltage Vqpw). After time T5, the word lines associated with the odd and even NAND strings may be charged up in order to couple up the inhibited or floated channels via a self-boosted program inhibit scheme. After the inhibited or floated channels have been boosted, a programming voltage may be applied to a selected word line in order to program memory cells associate with the even NAND strings selected for programming.

FIG. 10B depicts an alternative embodiment of a NAND string setup scheme used prior to self-boosting of the NAND string. As depicted, at time T1, BL0 and BL1 are charged up to a bit line inhibit voltage (e.g., 2V) and both SGDO and SGDE are charged up to Vsg (e.g., 4V or other voltage that allows the bit line voltage to fully pass to the NAND strings) in order to precharge the channels of both the odd NAND strings and the even NAND strings. As both SGDO and SGDE are set high, the channels of both the odd and even NAND strings are charged up to the bit line inhibit voltage.

At time T2, SGDO is discharged to 0V and SGDE stays high. At time T3, BL1 is set to a bit line programming voltage (e.g., 0V). In response, the channel of the even NAND string ("BL1 channel E") is driven to 0V in preparation for programming a memory cell associated with the even NAND string controlled by BL1. Because the channels of the odd NAND strings are left floating, the discharge of "BL1 channel E" from 2.0V to 0V will cause the floating channel of "BL1 channel O" to couple down as well. Assuming a channel coupling ratio of 40%, "BL1 channel O" will couple down to 1.2V (i.e., 2V−2.0V*0.4).

As BL0 stays high, the channel of the inhibited even NAND string will stay high. The potential bump in BL0 at time T3 is caused by capacitive coupling from BL1 being discharged to a bit line programming voltage (e.g., 0V). As the channels of the odd NAND strings are floated, "BL0 channel O" may couple down due to second order coupling (e.g., from an adjacent odd channel being coupled down). At time T4, SGDE is discharged to 0V. At time T5, SGDE is set to Vsgd (e.g., 2V). In some cases, the bit line programming voltage may be adjusted in order to slow down programming of memory cells (e.g., by increasing the bit line voltage to a quick pass write voltage Vqpw). After time T5, the word lines associated with the odd and even NAND strings may be charged up in order to couple up the inhibited or floated channels via a self-boosted program inhibit scheme. After the inhibited or floated channels have been boosted, a programming voltage may be applied to a selected word line in order to program memory cells associate with the even NAND strings selected for programming.

FIG. 10C depicts one embodiment of a NAND string setup scheme used prior to self-boosting of the NAND string. As depicted, at time T1, BL0 and BL1 are charged up to a bit line inhibit voltage (e.g., 2V) and SGDO is charged up to Vsg (e.g., 4V or other voltage that allows the bit line voltage to fully pass to the NAND strings) in order to precharge the channels of the odd NAND strings. Since SGDE is set at 0V, the channels of the even NAND strings are floated, as shown by the dotted lines. However, due to capacitive coupling between the charged up channels of adjacent odd NAND strings, the channels of the even NAND strings are coupled up. Assuming a channel coupling ratio of 40%, the channels of the even NAND strings will couple up to 0.8V (i.e., 2V*0.4). The bump in SGDE at time T1 is caused by capacitive coupling from SGDO charging up.

At time T2, SGDO is discharged to 0V and SGDE is charged up to Vsg. In response, the channels of the odd NAND strings are floated while the channels of the even NAND strings are charged up to the bit line voltages. In some cases, a timing offset may be used to ensure that the channels of the odd NAND strings are floated before the channels of the even NAND strings are charged up to the bit line inhibit voltage. Assuming a channel coupling ratio of 40%, the channels of the odd NAND strings will couple up to 2.48V (i.e., 2V+1.2V*0.4).

At time T3, BL1 is set to a bit line programming voltage (e.g., 0V). In response, the channel of the even NAND string ("BL1 channel E") is driven to 0V in preparation for programming a memory cell associated with the even NAND string controlled by BL1. Because the channels of the odd NAND strings are left floating, the discharge of "BL1 channel E" from 2.0V to 0V will cause the floating channel of "BL1 channel O" to couple down as well. Assuming a channel coupling ratio of 40%, "BL1 channel O" will couple down to 1.68V (i.e., 2.48V−2.0V*0.4). Because SGDE is already high, the potential charge leakage path due to BL0 being coupled down by BL1 and SGDO being coupled up by SGDE depicted in FIG. 10A will not occur.

As BL0 stays high, the channel of the inhibited even NAND string will stay high. The potential bump in BL0 at time T3 is caused by capacitive coupling from BL1 being discharged to a bit line programming voltage (e.g., 0V). As the channels of the odd NAND strings are floated, "BL0 channel O" may couple down due to second order coupling (e.g., from an adjacent odd channel being coupled down). At time T4, SGDE is discharged to 0V. At time T5, SGDE is set to Vsgd (e.g., 2V). In some cases, the bit line programming voltage may be adjusted in order to slow down programming of memory cells (e.g., by increasing the bit line voltage to a quick pass write voltage Vqpw). After time T5, the word lines associated with the odd and even NAND strings may be charged up in order to couple up the inhibited or floated channels via a self-boosted program inhibit scheme. After the inhibited or floated channels have been boosted, a programming voltage may be applied to a selected word line in order to program memory cells associate with the even NAND strings selected for programming.

One benefit of the setup scheme depicted in FIG. 10C is that the channel voltages of the odd NAND strings (i.e., the NAND strings not selected for programming) remain fairly close to the channel voltages of the inhibited even NAND strings prior to self-boosting (e.g., "BL1 channel O" is 1.68V at time T4 of FIG. 10C versus 1.2V at time T4 of FIG. 10B). Another benefit is that the potential leakage issue of FIG. 10A has been eliminated as the bit lines associated with memory cells to be programmed are switched after SGDO and SGDE are stable.

Figure 10D:
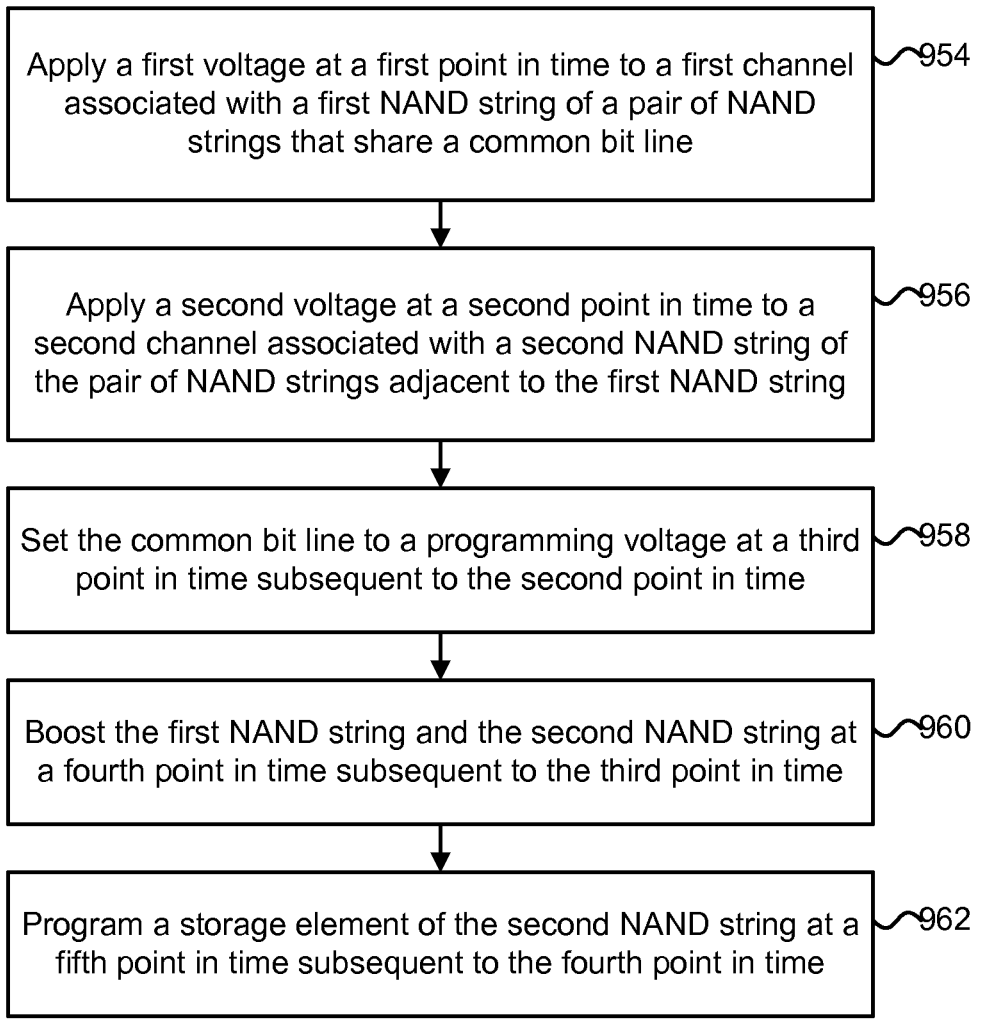
FIG. 10D is a flowchart describing one embodiment of a process for precharging a pair of NAND strings prior to self-boosting of the pair of NAND strings.

FIG. 10D is a flowchart describing one embodiment of a process for precharging a pair of NAND strings prior to self-boosting of the pair of NAND strings. In one embodiment, the process of FIG. 10D may be performed by a non-volatile storage system, such as non-volatile storage system 596 in FIG. 6A.

In step 954, a first voltage is applied at a first point in time to a first channel associated with a first NAND string of a pair of NAND strings that share a common bit line. The pair of NAND strings may comprise the first NAND string (e.g., an odd NAND string) and a second NAND string (e.g., an even NAND string). The first voltage may comprise a bit line inhibit voltage or a bit line precharge voltage. In some cases, while the first channel is set to the first voltage, one or more word lines associated with the first NAND string and the second NAND string may be biased to a pass voltage or other voltage that allows the first channel to be biased to the first voltage. In step 956, a second voltage is applied at a second point in time to a second channel associated with the second NAND string of the pair of NAND strings adjacent to the first NAND string. The second voltage may comprise a bit line inhibit voltage or a bit line precharge voltage. In some cases, while the second channel is set to the second voltage, the one or more word lines associated with the first NAND string and the second NAND string may be biased to a pass voltage or other voltage that allows the second channel to be biased to the second voltage.

If the second channel is floated at the first point in time, then the charging of the first channel will boost the second channel to a first boosted voltage less than the first voltage via capacitive coupling. If the first channel is floated at the second point in time, then the charging of the second channel will boost the first channel to a second boosted voltage greater than the first voltage via capacitive coupling. By setting the first channel to the second boosted voltage, the channel voltage of the first NAND string (i.e., the NAND string not selected for programming) will remain fairly close to the bit line inhibit voltage after coupling due adjacent NAND strings to be programmed.

In step 958, the common bit line is set to a programming voltage at a third point in time subsequent to the second point in time. In one example, the common bit line is set to 0V. In step 960, both the first NAND string and the second NAND string are boosted (e.g., via self-boosting) at a fourth point in time subsequent to the third point in time. In step 962, a storage element of the second NAND string is programmed at a fifth point in time subsequent to the fourth point in time. In one example, a programming voltage is applied to a selected word line in communication with both the first NAND string and the second NAND string.

One embodiment of the disclosed technology includes a first NAND string, a second NAND string, and one or more managing circuits in communication with the first NAND string and the second NAND string. The first NAND string in communication with a shared bit line. The first NAND string includes a first channel. The second NAND string in communication with the shared bit line. The second NAND string includes a second channel. The one or more managing circuits precharge the first channel to a first voltage at a first point in time, the precharging of the first channel boosts the second channel to a first boosted voltage less than the first voltage. The one or more managing circuits precharge the second channel to the first voltage at a second point in time subsequent to the first point in time, the precharging of the second channel boosts the first channel to a second voltage greater than the first voltage. The one or more managing circuits set the shared bit line to a programming voltage at a third point in time subsequent to the second point in time.

One embodiment of the disclosed technology includes applying a first voltage at a first point in time to a first channel associated with a first NAND string and applying a second voltage at a second point in time subsequent to the first point in time to a second channel associated with a second NAND string. The second NAND string is adjacent to the first NAND string. The second NAND string and the first NAND string share a common bit line. The applying a first voltage boosts the second channel to a first boosted voltage less than the first voltage. The applying a second voltage boosts the first channel to a second boosted voltage greater than the first voltage. The method further includes setting the common bit line to a programming voltage at a third point in time subsequent to the second point in time and programming a storage element of the second NAND string at a fourth point in time subsequent to the third point in time.

One embodiment of the disclosed technology includes a first bit line, a plurality of word lines, a first selection line, a second selection line, a first NAND string, and a second NAND string. The first NAND string in communication with the first bit line. The first NAND string includes a first plurality of non-volatile storage elements and a first selection gate. The first NAND string includes a first channel. The second NAND string in communication with the first bit line. The second NAND string includes a second plurality of non-volatile storage elements and a second selection gate. The second NAND string includes a second channel. The plurality of word lines are in communication with the first NAND string and the second NAND string. The first selection line is connected to the first selection gate and the second selection line is connected to the second selection gate. The first channel is set to a first voltage at a first point in time and the second channel is set to the first voltage at a second point in time subsequent to the first point in time. The setting of the second channel to the first voltage boosts the first channel to a second voltage greater than the first voltage. The first bit line is biased to a bit line programming voltage at a third point in time subsequent to the second point in time.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile storage system, comprising:
a first NAND string in communication with a shared bit line, the first NAND string includes a first channel;
a second NAND string in communication with the shared bit line, the second NAND string includes a second channel; and
one or more managing circuits in communication with the first NAND string and the second NAND string, the one or more managing circuits precharge the first channel to a first voltage at a first point in time, the precharging of the first channel boosts the second channel to a first boosted voltage less than the first voltage, the one or more managing circuits precharge the second channel to the first voltage at a second point in time subsequent to the first point in time, the precharging of the second channel boosts the first channel to a second voltage greater than the first voltage, the one or more managing circuits set the shared bit line to a programming voltage at a third point in time subsequent to the second point in time.

2. The non-volatile storage system of claim 1, wherein:
the second NAND string is adjacent to the first NAND string.

3. The non-volatile storage system of claim 1, wherein:
the one or more managing circuits apply a programming voltage to a selected word line at a fourth point in time subsequent to the third point in time.

4. The non-volatile storage system of claim 1, wherein:
the one or more managing circuits bias the shared bit line to the first voltage at the first point in time and bias the shared bit line to the first voltage at the second point in time.

5. The non-volatile storage system of claim 1, wherein:
the first voltage comprises a bit line inhibit voltage.

6. The non-volatile storage system of claim 1, wherein:
the one or more managing circuits apply a self-boosted program inhibit scheme to the first NAND string and the second NAND string at a fourth point in time subsequent to the third point in time.

7. The non-volatile storage system of claim 1, wherein:
the one or more managing circuits precharge the first channel to the first voltage at the first point in time by applying a bit line inhibit voltage to the shared bit line.

8. The non-volatile storage system of claim 7, wherein:
the one or more managing circuits precharge the second channel to the first voltage at the second point in time by applying the bit line inhibit voltage to the shared bit line.

9. The non-volatile storage system of claim 1, wherein:
the first NAND string includes a first drain-side select gate in communication with a first select line; and
the second NAND string includes a second drain-side select gate in communication with a second select line different from the first select line.

10. The non-volatile storage system of claim 9, further comprising:

a third NAND string including a third drain-side select gate in communication with the first select line, the third NAND string is adjacent to the second NAND string; and
a fourth NAND string including a fourth drain-side select gate in communication with the second select line, the fourth NAND string is adjacent to the third NAND string.

11. The non-volatile storage system of claim 9, further comprising:
a third NAND string including a third drain-side select gate in communication with the second select line, the third NAND string is adjacent to the second NAND string; and
a fourth NAND string including a fourth drain-side select gate in communication with the first select line, the fourth NAND string is adjacent to the third NAND string.

12. The non-volatile storage system of claim 1, wherein:
the one or more managing circuits increase the programming voltage applied to the shared bit line at a fourth point in time subsequent to the third point in time.

13. A method for operating a non-volatile storage system, comprising:
applying a first voltage to a first channel associated with a first NAND string;
applying a second voltage to a second channel associated with a second NAND string subsequent to the applying a first voltage, the second NAND string is adjacent to the first NAND string, the second NAND string and the first NAND string share a common bit line, the applying a first voltage boosts the second channel to a first boosted voltage less than the first voltage, the applying a second voltage boosts the first channel to a second boosted voltage greater than the first voltage;
setting the common bit line to a programming voltage subsequent to the applying a second voltage;
boosting the first NAND string and the second NAND string subsequent to the setting the common bit line; and
programming a storage element of the second NAND string subsequent to the boosting the first NAND string and the second NAND string.

14. The method of claim 13, wherein:
the first voltage comprises a bit line inhibit voltage.

15. The method of claim 13, wherein:
the setting the common bit line to a programming voltage includes biasing the common bit line substantially close to ground; and
the boosting the first NAND string and the second NAND string includes applying a self-boosted program inhibit scheme to the first NAND string and the second NAND string.

16. The method of claim 13, wherein:
the applying a first voltage includes applying a bit line inhibit voltage to the common bit line.

17. The method of claim 13, wherein:
the applying a second voltage includes applying a bit line inhibit voltage to the common bit line.

18. A non-volatile storage system, comprising:
a first bit line;
a plurality of word lines;
a first selection line;
a second selection line;
a first NAND string in communication with the first bit line, the first NAND string includes a first plurality of non-volatile storage elements and a first selection gate, the first NAND string includes a first channel; and a second NAND string in communication with the first bit line, the second NAND string includes a second plurality of non-volatile storage elements and a second selection gate, the second NAND string includes a second channel, the plurality of word lines are in communication with the first NAND string and the second NAND string, the first selection line is connected to the first selection gate, the second selection line is connected to the second selection gate, the first channel is set to a first voltage at a first point in time, the second channel is set to the first voltage at a second point in time subsequent to the first point in time, the setting of the second channel to the first voltage boosts the first channel to a second voltage greater than the first voltage, the first bit line is biased to a bit line programming voltage at a third point in time subsequent to the second point in time.

19. The non-volatile storage system of claim 18, wherein:
the second NAND string is adjacent to the first NAND string.

20. The non-volatile storage system of claim 19, wherein:
the first voltage comprises a bit line inhibit voltage.

* * * * *